United States Patent [19]

Ikeda et al.

[11] Patent Number: 4,990,991

[45] Date of Patent: Feb. 5, 1991

[54] BIPOLAR TRANSISTOR AND METHOD OF MANUFACTURING THE SAME

[75] Inventors: Tatsuhiko Ikeda; Kazuyuki Sugahara; Shigeru Kusunoki; Kyusaku Nishioka, all of Itami, Japan

[73] Assignee: Mitsubishi Denki Kabushiki Kaisha, Tokyo, Japan

[21] Appl. No.: 115,049

[22] Filed: Oct. 30, 1987

[30] Foreign Application Priority Data

Dec. 1, 1986 [JP] Japan ................... 61-287325

[51] Int. Cl.$^5$ ............ H01L 29/72; H01L 27/01; H01L 27/02; H01L 29/04
[52] U.S. Cl. ................... 357/34; 357/23.7; 357/35; 357/44; 357/59; 357/71
[58] Field of Search ............ 357/35, 34, 44, 59, 357/71, 23.7

[56] References Cited

U.S. PATENT DOCUMENTS

| | | | |
|---|---|---|---|
| 4,546,536 | 10/1985 | Anantha et al. | 357/57 X |
| 4,586,968 | 5/1986 | Coello-Vera | 357/35 X |
| 4,703,554 | 11/1987 | Havemann | 357/34 X |
| 4,922,315 | 5/1990 | Vu | 357/23.7 X |

FOREIGN PATENT DOCUMENTS 0059264 12/1981 European Pat. Off. .
0059266 12/1981 European Pat. Off. .

OTHER PUBLICATIONS

Rodder et al., "Silicon-on-Insulator Bipolar Transistors", IEEE Electron Device Letters, vol. EDL-4, No. 6, Jun. 1983, 193-195.
IEEE Electron Device Letters, vol. EDL-4, No. 8, Aug. 1983, pp. 269-271, "Fully Isolated Lateral Bipolar-MOS Transistors Fabricated in Zone-Melting-Recrystallized Si Films on SiO$_2$".

Primary Examiner—Rolf Hille
Assistant Examiner—Roy Potter
Attorney, Agent, or Firm—Oblon, Spivak, McClelland, Maier & Neustadt

[57] ABSTRACT

Disclosed herein is a bipolar transistor and a method of manufacturing the same. The present invention provides a biolar transistor in which a collector layer, a base layer and an emitter layer are transversely arranged in sequence through a monocrystal silicon layer formed on an insulation layer of a semiconductor substrate and a method of manufacturing the same. According to the present invention, parasitic capacity between a base and a collector can be reduced and p-n junction capacity between the collector and the substrate can be removed, thereby to achieve high-speed operation.

3 Claims, 9 Drawing Sheets

BIPOLAR TRANSISTOR AND METHOD OF MANUFACTURING THE SAME

BACKGROUND OF THE INVENTION

1. Field of the Invention

The present invention relates to a bipolar transistor which can achieve high-speed operation and a method of manufacturing the same.

2. Description of the Prior Art

Figure 4:
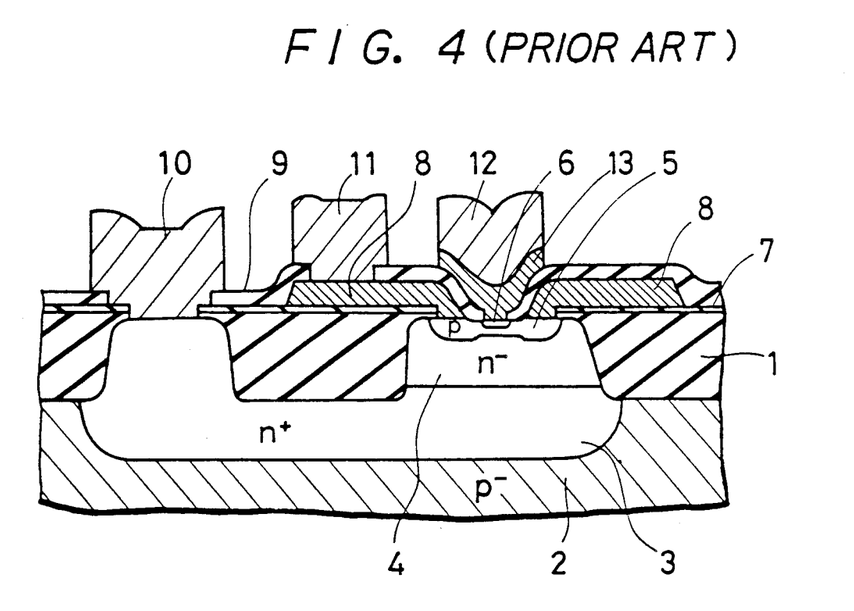
FIG. 4 is a sectional view showing a conventional bipolar transistor.
Figure 5:
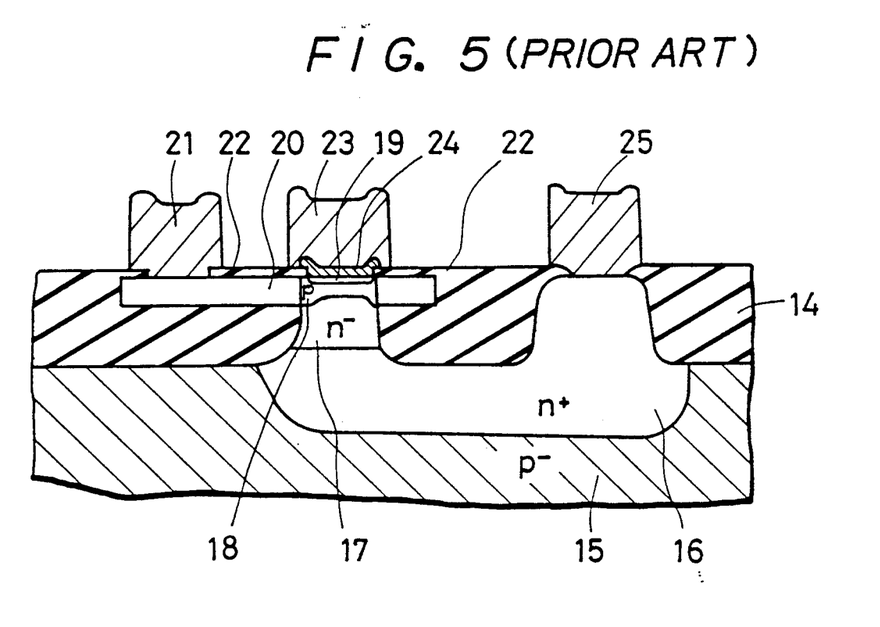
FIG. 5 is a sectional view showing another conventional bipolar transistor.

FIGS. 4 and 5 illustrate well-known examples of conventional bipolar transistors for achieving high-speed operation.

The bipolar transistor as shown in FIG. 4 comprises a $p^-$-type semiconductor substrate 2 which is formed on its element region, being isolated by an oxide film 1, with an $n^+$-type collector buried layer 3, an $n^-$-type epitaxial growth layer 4, a p-type base diffusion layer 5 and an $n^{++}$-type emitter diffusion layer 6. A nitride film 7 is formed on the oxide film 1 and a polycrystal silicon layer 8 for extracting a base electrode is formed on the nitride film 7 with a prescribed pattern, while an oxide film 9 for passivation is formed on the polycrystal silicon layer 8 and the nitride film 7. A collector electrode interconnection layer 10 is connected with the collector buried layer 3 through a contact hole defined in the oxide films 1 and 9 and the nitride film 7. A base electrode interconnection layer 11 is connected with the polycrystal silicon layer 8 through a contact hole defined in the oxide film 9. Further, an emitter electrode interconnection layer 12 is connected with the emitter diffusion layer 6 through a polycrystal silicon layer 13 for emitter layer diffusion and emitter electrode extraction.

The bipolar transistor as shown in FIG. 5 comprises a $p^-$-type semiconductor substrate 15 formed on its element region, being isolated by an oxide film 14, with an $n^+$-type collector buried layer 16, an $n^-$-type epitaxial growth layer 17, a p-type base diffusion layer 18, an $n^{++}$-type emitter diffusion layer 19 and a polycrystal silicon layer 20 for extracting a base electrode. A base electrode interconnection layer 21 is connected with the polycrystal silicon layer 20 through a contact hole defined in an oxide film 22. An emitter electrode interconnection layer 23 is connected with the emitter diffusion layer 19 through a polycrystal silicon layer 24 for emitter layer diffusion and emitter electrode extraction. Further, a collector electrode interconnection layer 25 is connected with the collector buried layer 16 through a contact hole defined in the oxide film 22.

Both of these bipolar transistors are adapted to reduce parasitic capacity and resistance by refinement for achieving high-speed operation, while improving cutoff frequency ($F_r$) by horizontal size reduction of the base diffusion layers 5 and 18.

In the case of the bipolar transistor as shown in FIG. 4, mask alignment for forming the base diffusion layer 5 may be performed only once so that the emitter diffusion layer 6 is thereafter formed in a self-alignment manner, whereby the width of the emitter diffusion layer 6 can be refined to about 0.5 μm in order to attain high-speed operation. In the case of the bipolar transistor as shown in FIG. 5, on the other hand, an outlet for extracting the base electrode may be provided on the side surface of the base diffusion layer 18 to substantially equalize the horizontal area of the emitter diffusion layer 19 with that of the base diffusion layer 18, thereby to achieve high-speed performance substantially identical to that of the bipolar transistor as shown in FIG. 4.

In such conventional bipolar transistors, however, base areas are determined by limitation in lithography and cannot be refined beyond the limitation. The base diffusion layer 5 is formed by ion implantation through the nitride film 7 serving as a mask in the case of FIG. 4 while the base diffusion layer 18 is formed by ion implantation through the oxide film 22 serving as a mask in the case of FIG. 5, whereby refinement of the areas of the base diffusion layers 5 and 18 is limited by lithography. Thus, floating capacity caused in p-n junction parts between bases and collectors cannot be reduced over a prescribed level, whereby high-speed operation is prevented. Further, the wide collector buried layers 3 and 16 for extracting electrodes from collectors are required in order to vertically drive the bipolar transistors, whereas floating p-n junction capacity is caused between the collector buried layers 3 and 16 and the silicon substrates 2 and 15 to prevent high-speed operation.

SUMMARY OF THE INVENTION

The present invention is directed to a bipolar transistor for achieving high-speed operation and a method of manufacturing the same.

The inventive bipolar transistor comprises a semiconductor substrate having at least a surface part being finished as an insulation layer, a first conductivity type monocrystal silicon layer formed on an element region of the semiconductor substrate, an insulation film for inter-element isolation formed on an isolation region of the semiconductor substrate to isolate adjacent ones of the monocrystal silicon layer, a second conductivity type diffusion layer and a first conductivity type diffusion layer formed in the monocrystal silicon layer by transverse diffusion in sequence from an opening defined in a part of the monocrystal silicon layer to reach the insulation layer of the semiconductor substrate, and electrode extracting layers connected to the monocrystal silicon layer, the second conductivity type diffusion layer respectively and the first conductivity type diffusion layer respectively while being isolated from each other.

The inventive method of manufacturing a bipolar transistor comprises a first step of oxidizing the surface of a semiconductor substrate and forming a first conductivity type monocrystal silicon layer on the same, a second step of forming an isolation region by an insulation film for inter-element isolation in a region of the monocrystal silicon layer other than an element region, a third step of introducing first conductivity type impurity into a region of the monocrystal silicon layer close to the insulation film for inter-element isolation and activating the impurity by heat treatment to form a collector electrode extracting layer, a fourth step of forming a first insulation layer on the monocrystal silicon layer and the insulation film for inter-element isolation and further depositing a first polycrystal silicon layer introduced with second conductivity type impurity, a fifth step of partially opening the first polycrystal silicon layer on the element region and subsequently opening the first insulation layer for partially exposing the surface region of the monocrystal silicon layer other than a part provided with the collector electrode extracting layer, a sixth step of depositing a second conductivity type second polycrystal silicon layer on the first polycrystal silicon layer and the exposed region of the monocrystal silicon layer, a seventh step of diffusing the second conductivity type impurity from the first and second polycrystal silicon layers into the monocrystal silicon layer by heat treatment to form a second conductivity type monocrystal silicon layer on the surface part of the first conductivity type monocrystal silicon layer, an eighth step of partially removing the first and second polycrystal silicon layers and the first and second conductivity type monocrystal silicon layers by anisotropic etching over the entire chip surface to leave a polycrystal silicon layer having a side wall region connected with the second conductivity type monocrystal silicon layer only on the first insulation layer, a ninth step of patterning the polycrystal silicon layer formed in the eighth step to serve as an electrode extracting region of the second conductivity type monocrystal silicon layer, a tenth step of depositing a nitride film on the entire chip surface and thereafter performing anisotropic etching to form a side wall of the nitride film only on side walls of the first and second conductivity type monocrystal silicon layers opened in the eighth step and a part of the polycrystal silicon layer, an eleventh step of oxidizing the entire chip surface and thereafter removing the nitride film formed in the tenth step, a twelfth step of depositing a second conductivity type third polycrystal silicon layer on the entire chip surface and thereafter diffusing second conductivity type impurity from the third polycrystal silicon layer to the first and second conductivity type monocrystal silicon layers by heat treatment, a thirteenth step of coating an insulating material, for example a liquid insulating material, containing high concentration of first conductivity type impurity on the entire chip surface and thereafter diffusing the first conductivity type impurity from the liquid insulating material to the third polycrystal silicon layer and a part of the second conductivity type monocrystal silicon layer by heat treatment, a fourteenth step of removing the insulating material and thereafter patterning the third polycrystal silicon layer to serve as an electrode extracting region of a first conductivity type diffusion layer formed in the monocrystal silicon layer in the thirteenth step, a fifteenth step of forming contact holes in the insulation layer on the collector electrode extracting layer formed in the third step and the insulation layer on the polycrystal silicon layer formed in the eighth step, and a sixteenth step of forming a collector electrode interconnection layer connected to the collector electrode extracting layer through the contact hole, a base electrode interconnection layer connected to the polycrystal silicon layer formed in the eighth step through the contact hole and an emitter electrode interconnection layer directly connected to the third polycrystal silicon layer.

Accordingly, a principal object of the present invention is to provide a bipolar transistor and a method of manufacturing the same, which can further reduce parasitic capacity between a base and a collector and that between the collector and a substrate to attain high-speed performance.

According to the present invention, a collector layer, a base diffusion layer and an emitter diffusion layer are arranged transversely in sequence through a monocrystal silicon layer formed on an insulation layer of a semiconductor substrate, whereby parasitic capacity between a base and a collector can be extremely reduced. Further, a collector diffusion layer is entirely covered by an insulation layer, whereby p-n junction capacity between the collector and the substrate can be removed. Thus, high-speed operation of the transistor can be attained.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
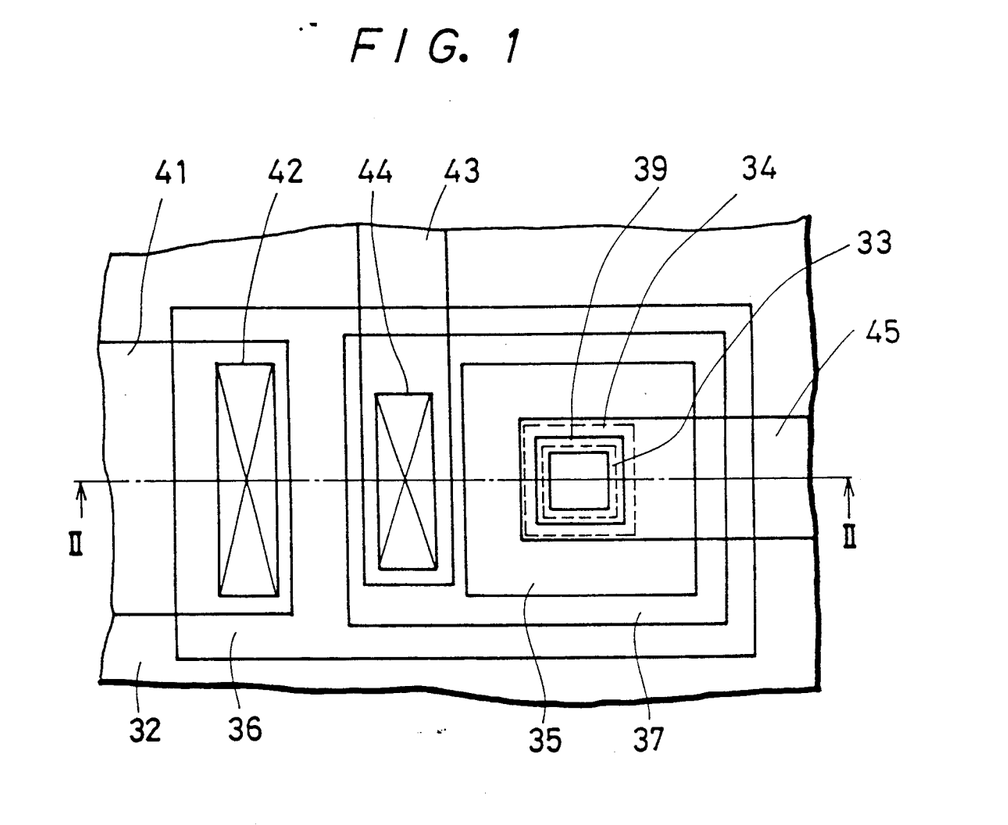
FIG. 1 is a plan view showing an embodiment of a bipolar transistor according to the present invention.
Figure 2:
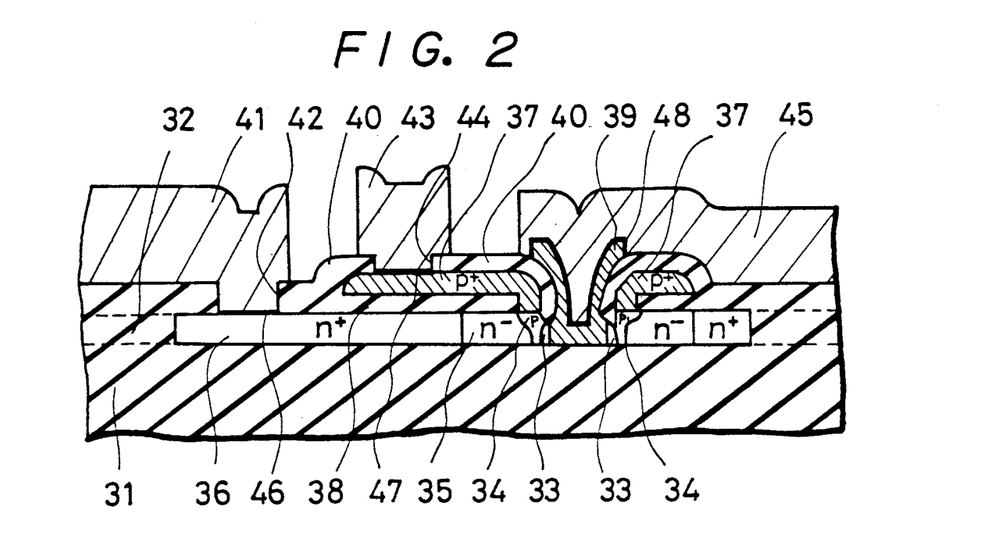
FIG. 2 is a sectional view taken along the line II—II in FIG. 1.

FIG. 1 is a plan view showing an embodiment of a bipolar transistor according to the present invention, and FIG. 2 is a sectional view taken along the line II—II of FIG. 1. As obvious from FIGS. 1 and 2, the bipolar transistor is provided with a silicon oxide film 31 which is formed on a silicon substrate to serve as an insulation layer. A monocrystal silicon layer isolated by an insulation film 32 for inter-element isolation is formed on the silicon oxide film 31. An $n^{++}$-type emitter diffusion layer 33, a p-type base diffusion layer 34, an $n^{-}$-type collector layer 35 and an $n^{+}$-type collector electrode extracting layer 36 are arranged transversely in sequence in the monocrystal silicon layer form a hole defined in a substantially central portion of the monocrystal silicon layer to reach the insulation layer 31 toward the insulation film 32 for inter-element isolation. A base electrode extracting layer 37 of $p^{+}$-type polycrystal silicon connected to an upper region of the emitter diffusion layer 33 is formed on the upper part of the monocrystal silicon layer through a first insulation layer 38. Further, an emitter electrode extracting layer 39 of n-type polycrystal silicon connected with the emitter diffusion layer 33 in a hole defined in the monocrystal silicon layer is formed on the upper part of the base electrode extracting layer 37 through a second insulation layer 40 which also serves as a passivation film. A collector electrode interconnection layer 41 is connected with the collector electrode extracting layer 36 through a contact hole 42 defined in the insulation layer 40 and 38. A base electrode interconnection layer 43 is connected with the base electrode extracting layer 37 through a contact hole 44 defined in the insulation film 40. Further, an emitter electrode interconnection layer 45 is directly connected to the emitter electrode extracting layer 39. In this case, silicide layers 46, 47 and 48 are formed on the lower parts of the contact holes 42 and 44 and the surface part of the emitter electrode extracting layer 39 to reduce contact resistance between the interconnection layers and the extracting layers.

Figure 3A:
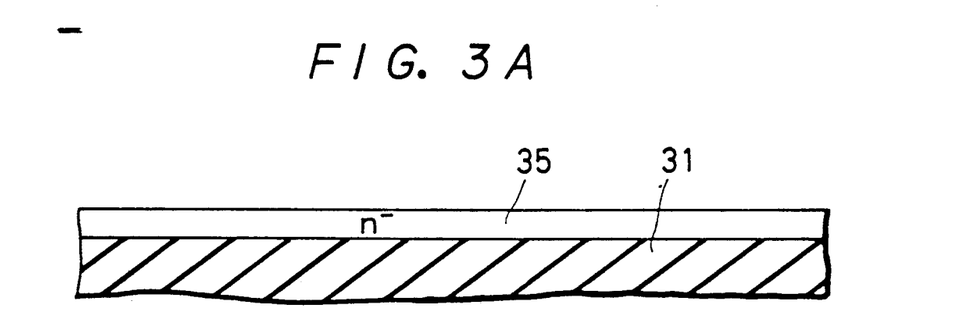
FIGS. 3A to 3S are sectional views for illustrating an embodiment of a method of manufacturing a bipolar transistor according to the present invention.
Figure 3B:
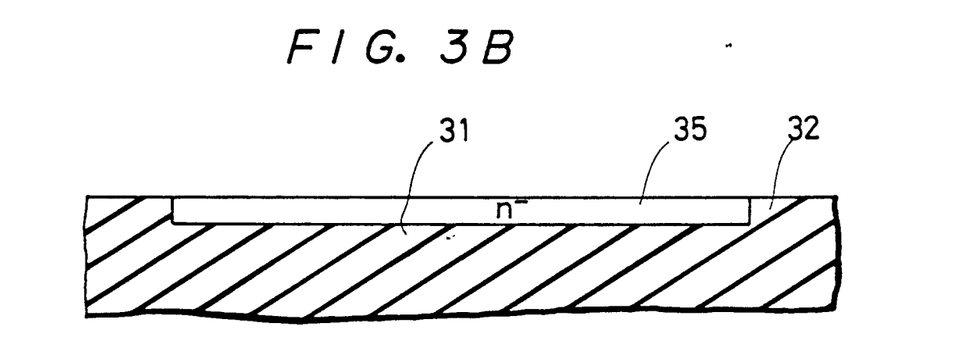
Figure 3C:
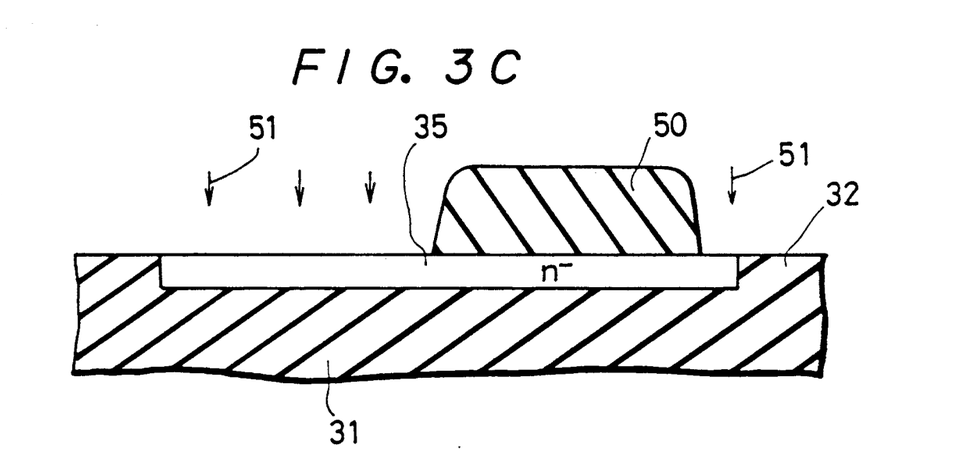
Figure 3D:
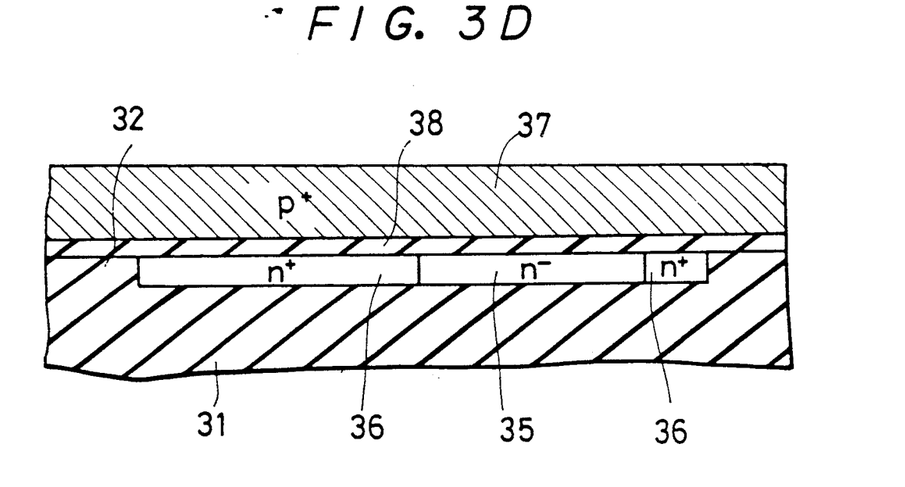
Figure 3E:
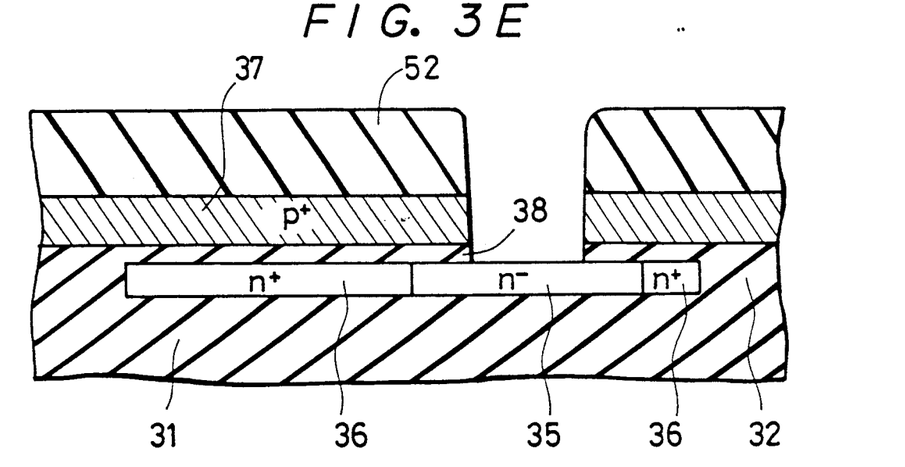
Figure 3F:
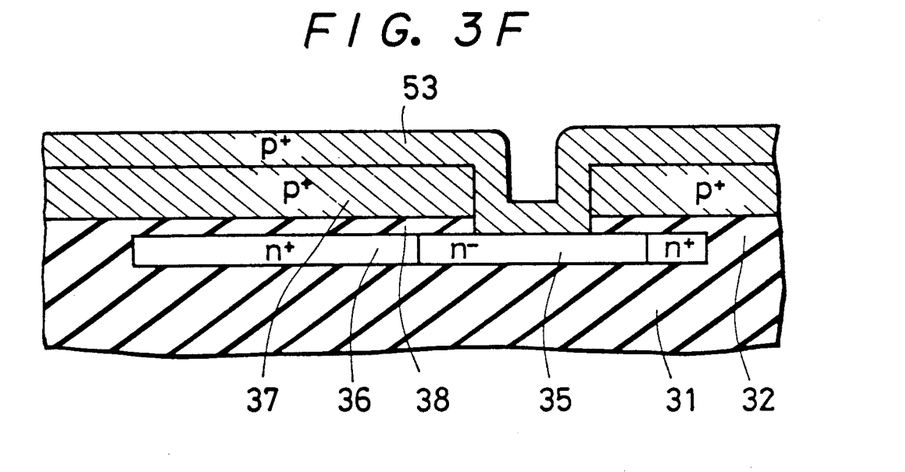
Figure 3G:
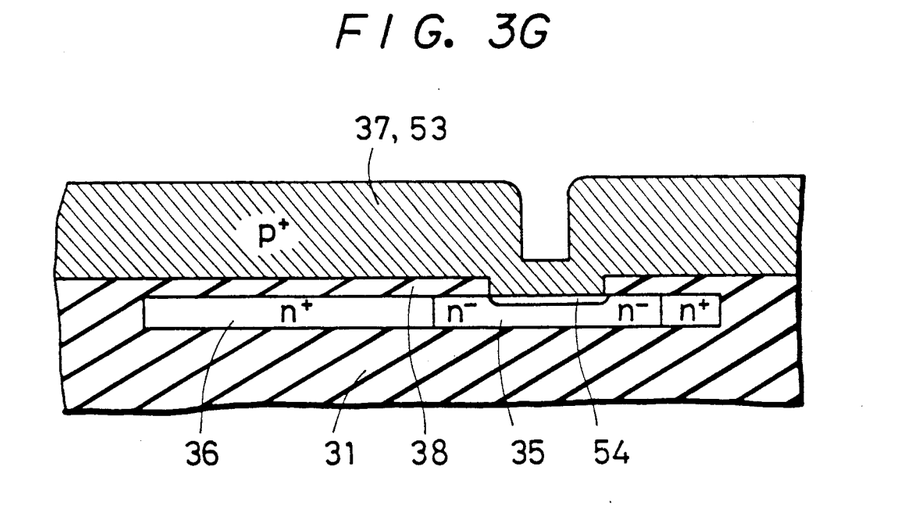
Figure 3H:
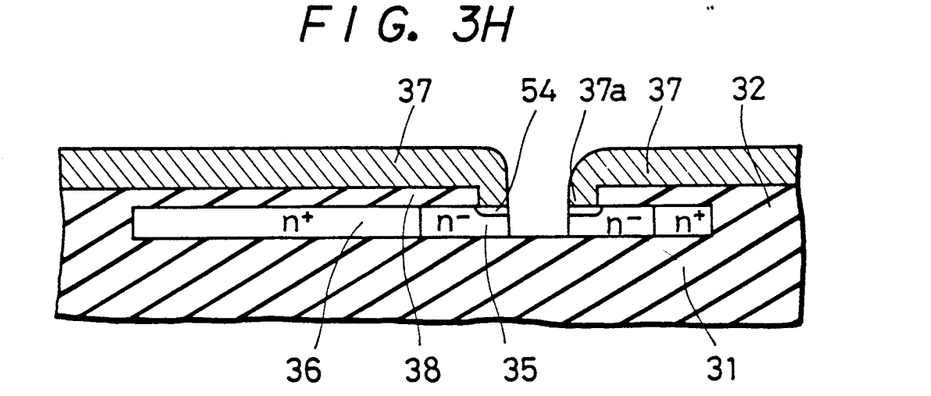
Figure 3I:
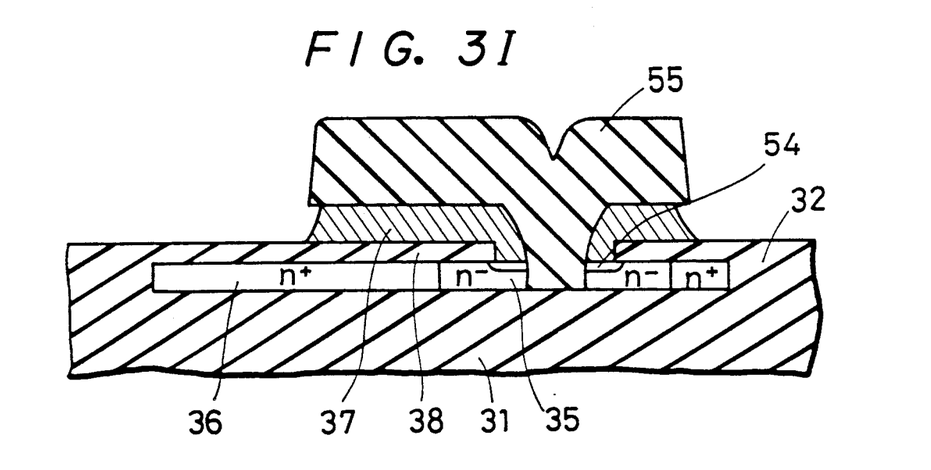
Figure 3J:
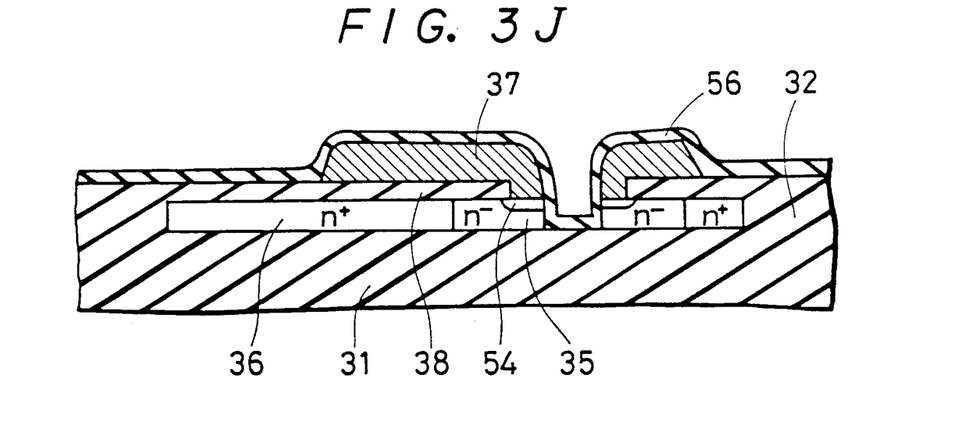
Figure 3K:
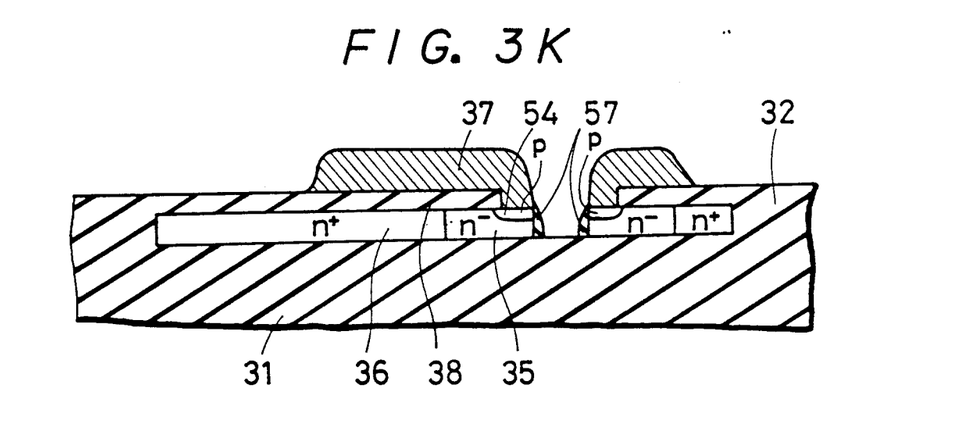
Figure 3L:
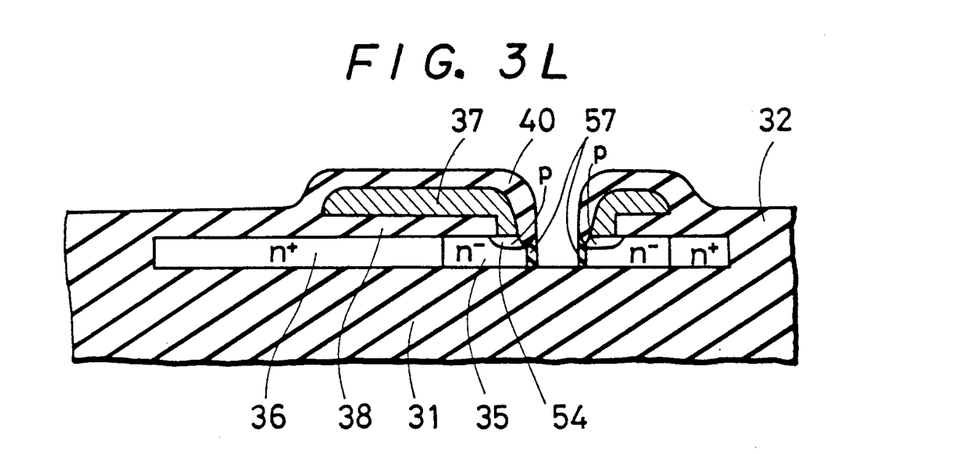
Figure 3M:
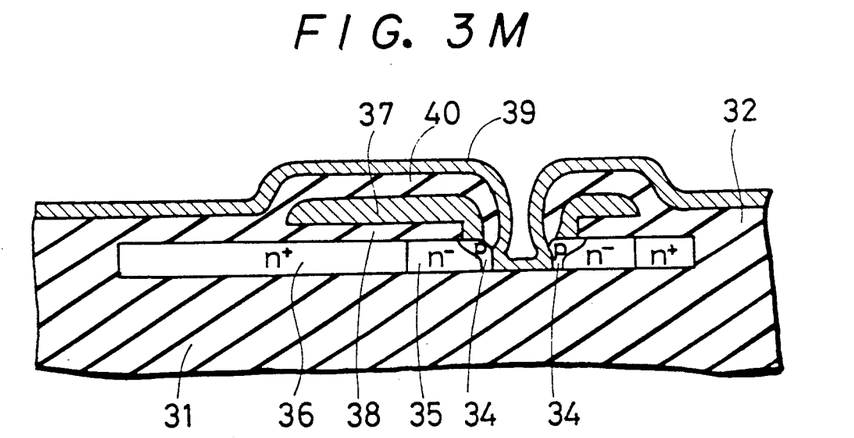
Figure 3N:
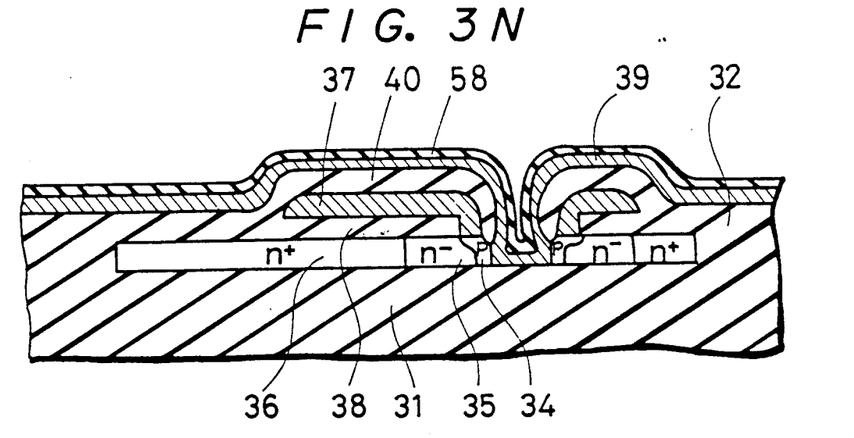
Figure 3O:
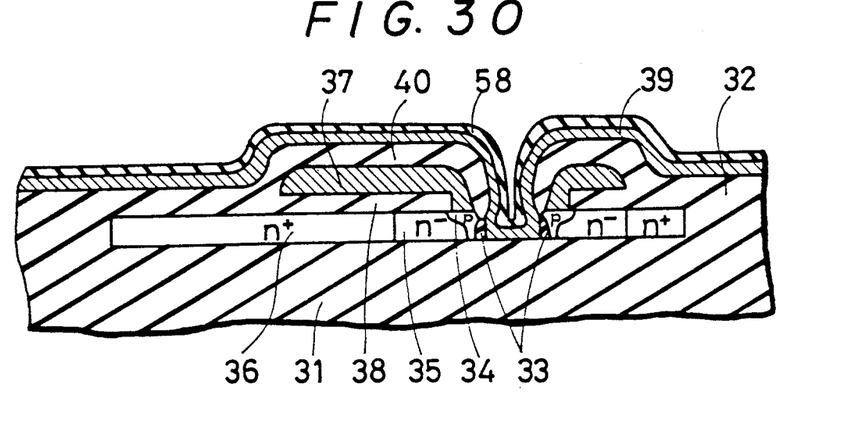
Figure 3P:
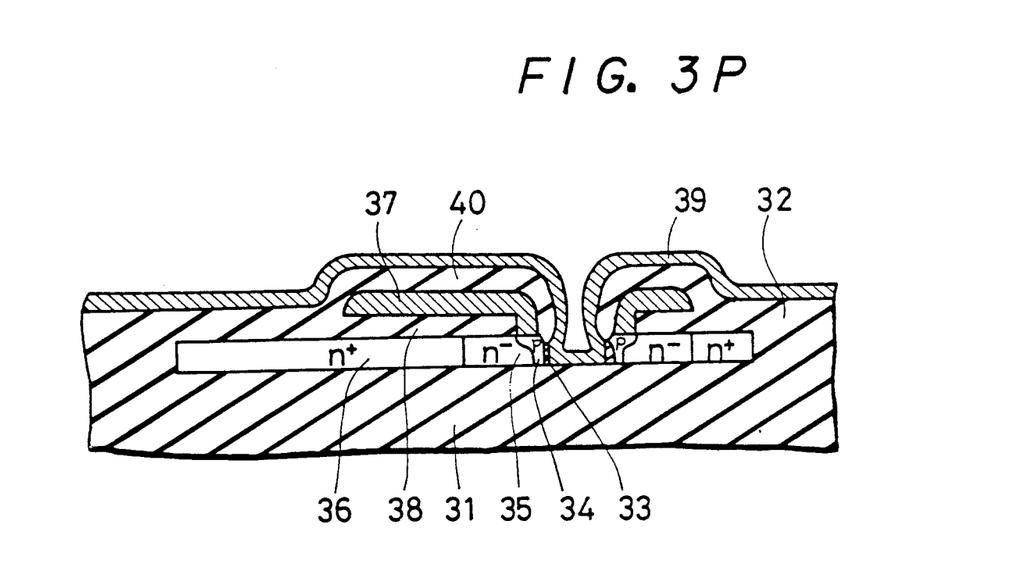
Figure 3Q:
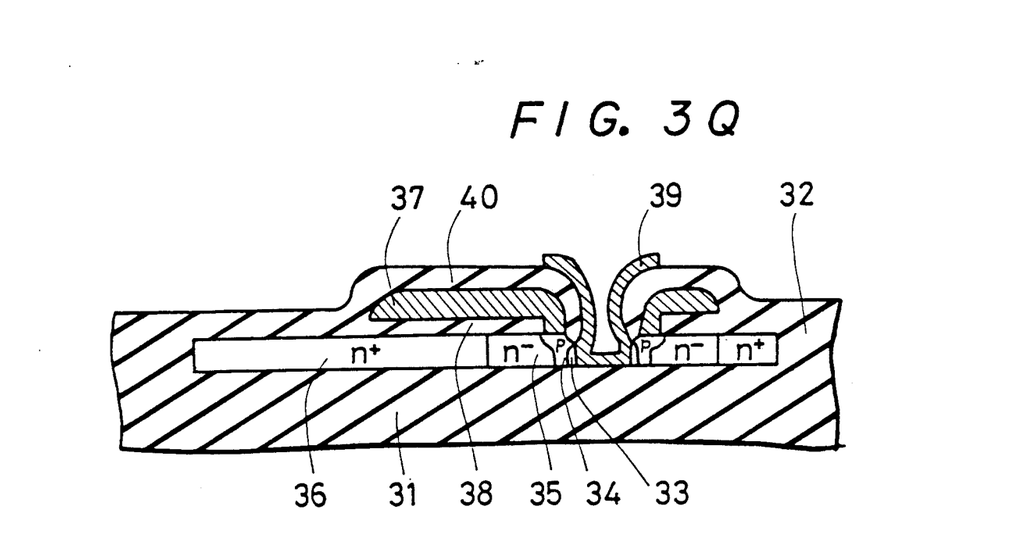
Figure 3R:
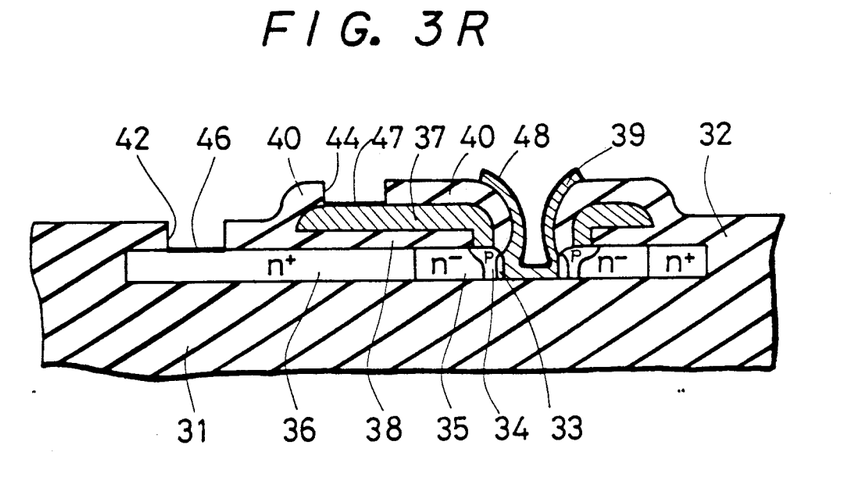
Figure 3S:
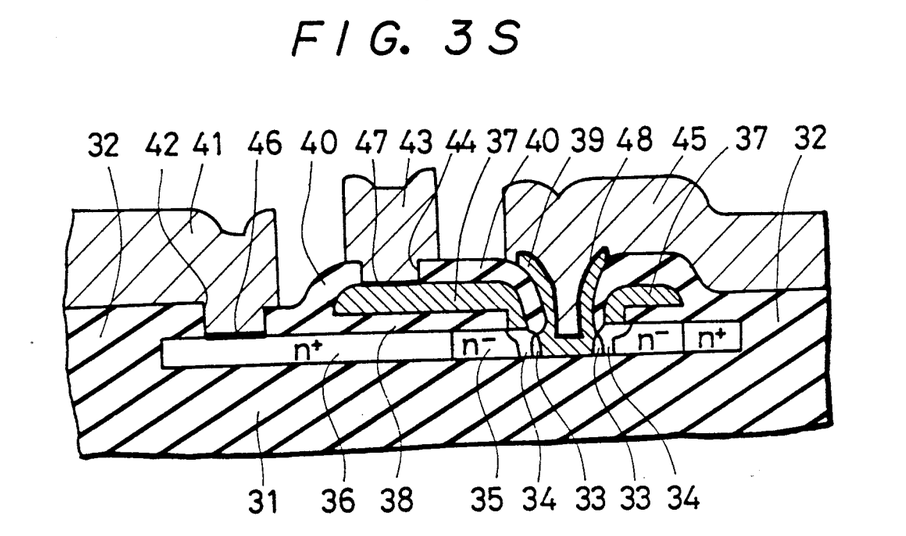

With reference to FIGS. 3A to 3S, description is now made on an embodiment of a method of manufacturing the aforementioned bipolar transistor. As shown in FIG. 3A, the surface of a silicon substrate is first oxidized to form a silicon oxide film 31, and a monocrystal silicon layer 35 is formed on the silicon oxide film 31 by a laser recrystallization method, for example. At this time, a suitable amount of desired impurity is so introduced that the monocrystal silicon layer 35 is of $n^-$-type conductivity.

Then, a region of the monocrystal silicon layer 35 other than an element region is oxidized by a selective oxidizing method or the like, to form an oxide film 32 for inter-element isolation as shown in FIG. 3B.

Then, as shown in FIG. 3C, a photoresist film 50 is formed on the monocrystal silicon layer 35 while avoiding a region corresponding to a collector electrode extracting region, and ions of n-type impurity such as As+ or Sb+ are implanted into the monocrystal silicon layer 35 from a direction indicated by an arrow 51 by utilizing the photoresist film 50 as a mask. Thereafter the photoresist film 50 is removed and the n-type impurity is activated by heat treatment, thereby to form a collector electrode extracting layer 36 as shown in FIG. 3D.

As shown in FIG. 3D, an insulation layer 38 of an oxide film is formed on the chip surface to deposit a first polycrystal silicon layer 37 doped with p-type impurity by a CVD method.

As shown in FIG. 3E, a photoresist film 52 is formed on the first polycrystal silicon layer 37 while avoiding regions for forming a base and an emitter, and the first polycrystal silicon layer 37 and the insulation layer 38 are removed by etching by utilizing the photoresist film 52 as a mask. Thus, a surface region of the monocrystal silicon layer 35 other than that provided with the collector electrode extracting layer 36 is partially exposed.

Then the photoresist film 52 is removed and thereafter a second polycrystal silicon layer 53 introduced with p-type impurity is deposited on the first polycrystal silicon layer 37 and the exposed region of the monocrystal silicon layer 35 by the CVD method.

The p-type impurity is slightly diffused into the monocrystal silicon layer 35 from the polycrystal silicon layers 37 and 53 by heat treatment, to form a p-type monocrystal silicon layer 54 on the surface part of the $n^-$-type monocrystal silicon layer 35.

THen anisotropic etching is performed over the entire chip surface to partially remove the polycrystal silicon layers 37 and 53 and the monocrystal silicon layers 35 and 54, thereby to leave the polycrystal silicon layer 37 having a sidewall region 37a connected with the monocrystal silicon layer 54 only on the insulation layer 38 as shown in FIG. 3H.

A photoresist film 55 is formed on a region of the polycrystal silicon layer 37 corresponding to a base electrode extracting region to perform etching by utilizing the photoresist film 55 as a mask as shown in FIG. 3I, thereby to pattern the polycrystal silicon layer 37. Thereafter the photo resist film 55 is removed and a nitride film 56 is deposited over the entire chip surface as shown in FIG. 3J.

Then the entire surface of the nitride film 56 is subjected to anisotropic etching to form a side wall 57 of a nitride film only on side walls of the monocrystal silicon layers 35 and 54 and a part of the polycrystal silicon layer 37.

Thereafter the entire chip surface is oxidized so that the surface of the polycrystal silicon layer 37 is oxidized in a state that oxidation of a portion provided with the side wall 57 of the nitride film is delayed, to form a second insulation layer 40.

The side wall 57 of the nitride film is removed by wet etching, and a third polycrystal silicon layer 39 containing p-type impurity is deposited on the entire chip surface by the CVD method. Thereafter heat treatment is performed to diffuse the p-type impurity from the third polycrystal silicon layer 39 to the monocrystal silicon layers 35 and 54, thereby to form a base diffusion layer 34.

An insulating material such as liquid glass containing high concentration of As or the like is rotatingly coated on the chip surface to cover the polycrystal silicon layer 39 by an insulating layer 58 containing n-type impurity as shown in FIG. 3N.

Then heat treatment is so performed as to diffuse the n-type impurity from the insulating layer 58 to the monocrystal silicon layer through the polycrystal silicon layer 39, thereby to form an emitter diffusion layer 33 as shown in FIG. 3O. At this time, the polycrystal silicon layer 39 is of n-type conductivity by the diffused impurity.

Then the insulating layer 58 is removed as shown in FIG. 3P, and the polycrystal silicon layer 39 is patterned as shown in FIG. 3Q to serve as an electrode extracting region for the emitter diffusion layer 33. In more concrete terms, a photoresist film is formed on a region of the polycrystal silicon layer 39 corresponding to the emitter electrode extracting region to perform etching by utilizing the photoresist film as a mask, and thereafter the photoresist film is removed to perform patterning.

As shown in FIG. 3R, the insulation layers 40 and 38 are partially opened to define a contact hole 42, while another part of the insulation layer 40 is opened to define a contact hole 44. In order to reduce contact resistance, the lower parts of the contact holes 42 and 44 and the surface part of the polycrystal silicon layer 39 are silicided to form silicide layers 46 to 48.

Finally, a collector electrode interconnection layer 41 of aluminum etc. is connected to the collector electrode extracting layer 36 through the contact hole 42 as shown in FIG. 3S. A base electrode interconnection layer 43 of aluminum etc. is connected with the base electrode extracting layer 37 through the contact hole 44. Further, an emitter electrode interconnection layer 45 of aluminum etc. is directly connected with the emitter electrode extracting layer 39. Thus, the bipolar transistor is completed.

In the aforementioned manufacturing process, FIG. 3A shows a first step, FIG. 3B shows a second step, FIG. 3C shows a third step, FIG. 3D shows a fourth step, FIG. 3E shows a fifth step, FIG. 3F shows a sixth step, FIG. 3G shows a seventh step, FIG. 3H shows an eighth step, FIG. 3I shows a ninth step, FIGS. 3J and 3K show a tenth step, FIG. 3L shows an eleventh step, FIG. 3M shows a twelfth step, FIGS. 3N and 3O shows a thirteenth step, FIGS. 3P and 3Q show a fourteenth step, FIG. 3R shows a fifteenth step and FIG. 3S shows a sixteenth step.

In the bipolar transistor thus manufactured, the emitter diffusion layer 33, the base diffusion layer 34 and the collector layer 35 are arranged transversely in sequence through the monocrystal silicon layer of small thickness formed on the oxide film 31 of the semiconductor substrate, whereby base-collector junction area is extremely decreased to extremely reduce base-collector parasitic capacity. Further, since the upper and lower surfaces of the collector diffusion layer 35 are covered by the insulating members of the oxide film 31 and the insulation layer 38, p-n junction capacity between the collector and the substrate can be removed. Thus, high-speed operation of the bipolar transistor can be achieved.

Although the emitter electrode extracting layer 39 is prepared by polycrystal silicon to form the base diffusion layer 34 and the emitter diffusion layer 33 through thermal diffusion of the impurity by the polycrystal silicon, the emitter electrode extracting layer 39 may be prepared by amorlphous silicon to form the base diffusion layer 34 and the emitter diffusion layer 33 through thermal diffusion of impurity by the amorlphous silicon.

Although the above embodiment has been described with reference to an npn transistor, the present invention is also applicable to a pnp transistor, to attain a similar effect to the above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar transistor for achieving high-speed operation comprising:
    a semiconductor substrate having at least a surface part being finished as an insulation layer;
    a first conductivity type monocrystal silicon layer formed on an element region of said semiconductor substrate;
    an insulation film for inter-element isolation formed on an isolation region of said semiconductor substrate for isolating adjacent ones of said monocrystal silicon layer;
    a second conductivity type diffusion layer and a first conductivity type diffusion layer formed in said monocrystal silicon layer by transverse diffusion in sequence from a hole defined in a part of said monocrystal silicon layer to reach said insulation layer of said semiconductor substrate; and
    electrode extracting layers connected to said monocrystal silicon layer, said second conductivity type diffusion layer and said first conductivity type diffusion layer respectively while being isolated from each other.

2. A bipolar transistor in accordance with claim 1, wherein
    a base electrode extracting layer connected to an upper region of said second conductivity type diffusion layer is formed on an upper part of said monocrystal silicon layer through a first insulation layer, an emitter electrode extracting layer connected to said first conductivity type diffusion layer in a hole defined in said monocrystal silicon layer is formed on an upper part of said base electrode extracting layer through a second insulation layer and a collector electrode extracting layer is formed by introduction of high concentration of first conductivity type impurity into a region of said monocrystal silicon layer close to said insulation film for inter-element isolation.

3. A bipolar transistor in accordance with claim 2, further comprising:
    a collector electrode interconnection layer connected with said collector electrode extracting layer through a first contact hole defined in said first insulation layer,
    a base electrode interconnection layer connected with said base electrode extracting layer through a second contact hole defined in said second insulation layer, and
    an emitter electrode interconnection layer directly connected to said emitter electrode extracting layer.

* * * * *